United States Patent
Kim et al.

(10) Patent No.: US 8,618,629 B2
(45) Date of Patent: Dec. 31, 2013

(54) APPARATUS AND METHOD FOR THROUGH SILICON VIA IMPEDANCE MATCHING

(75) Inventors: Jonghae Kim, San Diego, CA (US); Jeong Hwan Yang, San Diego, CA (US); Matthew M. Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 620 days.

(21) Appl. No.: 12/576,094

(22) Filed: Oct. 8, 2009

(65) Prior Publication Data

US 2011/0084358 A1    Apr. 14, 2011

(51) Int. Cl.
*H01L 27/08* (2006.01)
*H01L 21/00* (2006.01)

(52) U.S. Cl.
USPC ............ 257/531; 257/E29.166; 257/E21.022; 438/3

(58) Field of Classification Search
USPC ................ 257/531, E29.166, E21.022; 438/3
See application file for complete search history.

(56) References Cited

U.S. PATENT DOCUMENTS

| | | | | |
|---|---|---|---|---|
| 6,888,438 | B2 * | 5/2005 | Hui et al. | 336/200 |
| 2003/0045044 | A1 * | 3/2003 | Dentry et al. | 438/200 |
| 2004/0207042 | A1 * | 10/2004 | McCormack et al. | 257/532 |
| 2004/0209399 | A1 | 10/2004 | Sunohara et al. | |
| 2006/0071296 | A1 | 4/2006 | Nishijima | |
| 2006/0077102 | A1 * | 4/2006 | Mohamadi | 343/700 MS |
| 2006/0170071 | A1 * | 8/2006 | Imaoka et al. | 257/531 |
| 2006/0170515 | A1 * | 8/2006 | Yoshida et al. | 333/33 |
| 2008/0023824 | A1 * | 1/2008 | Salzman | 257/724 |
| 2008/0079636 | A1 * | 4/2008 | Mohamadi | 343/700 MS |
| 2008/0093747 | A1 | 4/2008 | Enquist et al. | |
| 2008/0116541 | A1 * | 5/2008 | Erturk et al. | 257/531 |
| 2008/0265399 | A1 * | 10/2008 | Chao | 257/698 |
| 2008/0315978 | A1 * | 12/2008 | Knight et al. | 333/24 C |
| 2009/0051005 | A1 | 2/2009 | Kwak | |
| 2009/0066461 | A1 | 3/2009 | Ezzeddine | |
| 2009/0160058 | A1 * | 6/2009 | Kuo et al. | 257/758 |

(Continued)

FOREIGN PATENT DOCUMENTS

EP    1107346 A2    6/2001

OTHER PUBLICATIONS

Soh et al., Ultra-Low Resistance, Through-Wafer Via (TWV) Technology and Its Applications in Three Dimensional Structures on Silicon, Jpn. J. Appl. Phys. vol. 38 (1999) pp. 2393-2396, Part 1, No. 4B. Apr. 1999.*

(Continued)

*Primary Examiner* — Matthew Landau
*Assistant Examiner* — Igwe U Anya
(74) *Attorney, Agent, or Firm* — Nicholas J. Pauley; Michelle Gallardo; Peter Michael Kamarchik (57) ABSTRACT

Methods and apparatuses for matching impedances in a flip-chip circuit assembly are presented. An apparatus for matching impedances in a flip-chip circuit assembly may include a first circuit associated with a first die and a through silicon via (TSV) coupling the first circuit to a second circuit. The apparatus may further include a first impedance matching inductor interposed between the TSV and the second circuit. A method for matching impedances in a flip-chip circuit assembly may include providing a die having a first circuit, and forming a TSV over the die. The method may further include providing a second circuit and forming a first impedance matching inductor interposed between the TSV and second circuit.

32 Claims, 7 Drawing Sheets

(56) References Cited

U.S. PATENT DOCUMENTS

| | | | |
|---|---|---|---|
| 2010/0193905 A1* | 8/2010 | Kim et al. | 257/531 |
| 2010/0214037 A1* | 8/2010 | Plager et al. | 333/185 |
| 2010/0244187 A1* | 9/2010 | Voldman | 257/531 |
| 2010/0244217 A1* | 9/2010 | Ha et al. | 257/686 |
| 2011/0031598 A1* | 2/2011 | Lee et al. | 257/686 |
| 2011/0079912 A1* | 4/2011 | Marcoux | 257/773 |
| 2011/0090058 A1* | 4/2011 | Ikemoto | 340/10.1 |
| 2012/0275123 A1* | 11/2012 | de Rochemont | 361/748 |

OTHER PUBLICATIONS

International Search Report and Written Opinion—PCT/US2010/051866, International Search Authority—European Patent Office—Mar. 2, 2011.

* cited by examiner

BACKGROUND ART

1. SLIDE VIEW OF TSV

FIG. 2B

2. TOP VIEW OF TSV

FIG. 2C 3. 3D VIEW OF TSV

APPARATUS AND METHOD FOR THROUGH SILICON VIA IMPEDANCE MATCHING

FIELD OF DISCLOSURE

Disclosed embodiments are generally directed to a method and apparatus for impedance matching of Through Silicon Vias (TSVs). More particularly, embodiments are related to compensating parasitic capacitances introduced by TSVs when coupling at circuits operating at RF frequencies.

BACKGROUND

Die stacking may be used in three-dimensional flip-chip integration, and typically involves mounting one or more chips on another chip in a single semiconductor package. This process can increase the amount of circuitry that can be housed within a package of a given size, and thus can reduce the area utilized on a printed circuit board. Die stacking may also simplify the assembly of printed circuit boards since multiple dies may be attached to a printed circuit board in a single operation. Die stacking also has the potential to improve the electrical performance of devices in which it is used since the interconnections between elements on each of the stacked dies may be shorter than the interconnections that would be required to connect the die elements on a planar surface. This can result in faster signal propagation and may also reduce cross-talk.

Figure 1:
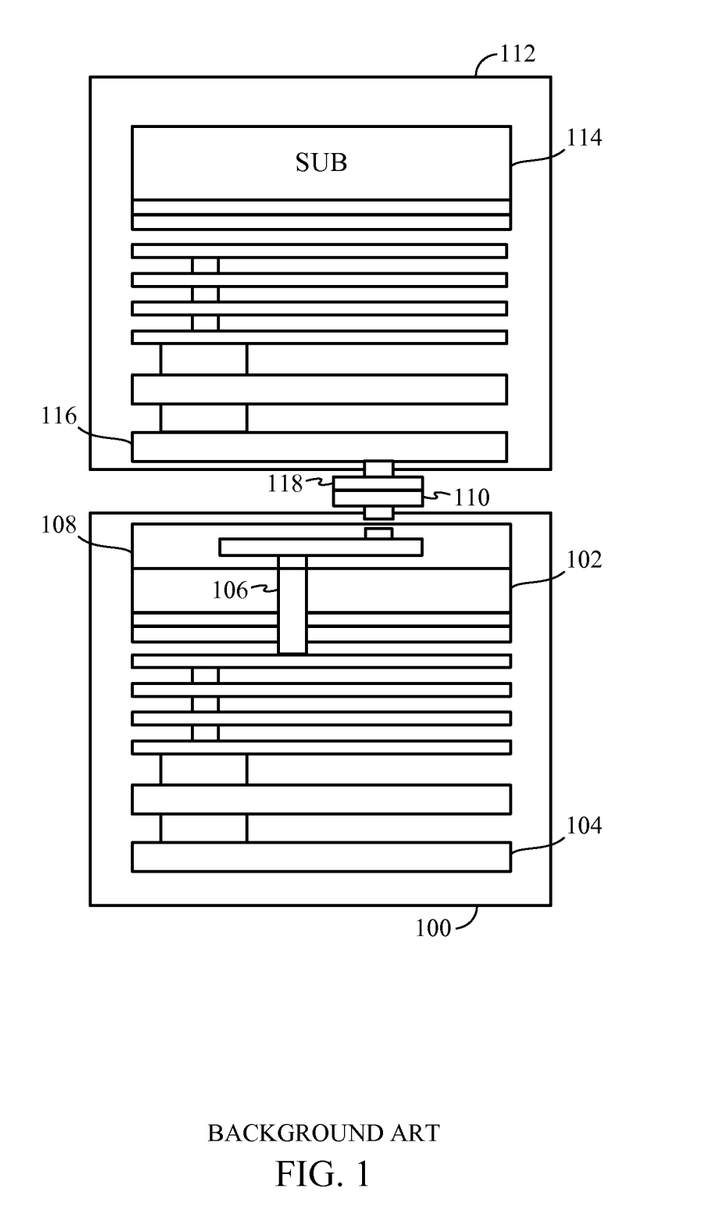
FIG. 1 is a diagram of a three dimensional flip chip assembly using a first and second die interconnected by a TSV.

Connections may be formed between circuits residing on stacked dies by using Through Silicon Vias (TSV's). As the name suggest, a TSV is a conductive via formed through a layer of silicon that provides electrical connections between circuits on both sides of the via. A conventional die stacking arrangement using TSV's is illustrated in FIG. 1. Here, a first die 100 is connected to a second die 112 using a TSV 106 and a microbump 110. The first die 100 may include a substrate 102 on which conventional layers of circuitry are formed and an outer metal layer 104. The through silicon via 106 may be formed in the substrate 102 by conventional processes, which can involve thinning the substrate to expose an end of the TSV 106, and a redistribution layer 108 may be added to the side of the substrate opposite the conventional layers of circuitry. The microbump 110 may be formed on the redistribution layer 108 to provide a mechanical/electrical connection to the TSV 106. A second die 112 that can be stacked on the first die 100 may include a substrate 114, an outer metal layer 116, and a microbump 118. Electrical connections are formed between the first die 100 and the second die 112 by inverting the second die 112 and connecting the microbump 118 on the second die 112 with the microbump 110 on the first die 100.

The TSV and the microbumps may form a connection set having two ports (not shown) which carry the signal bi-directionally between the circuits on the two dies 100 and 112. This arrangement may provide a satisfactory connection between stacked dies for signals having lower frequencies. However, at higher frequencies, such as, for example, RF frequencies over GHz, the connection set may introduce a parasitic reactance into the signal path. This parasitic reactance may be capacitive, and can adversely affect the performance of the circuitry associated with die 100 and/or die 112.

Accordingly, there is a need for improved coupling techniques used in three dimensional flip chip assemblies, which do not introduce parasitic impedances that may affect the performance of integrated circuits.

SUMMARY

The disclosed embodiments are directed to methods and apparatuses for matching impedances in a flip-chip circuit assembly.

In one embodiment, an apparatus for matching impedances in a flip-chip circuit assembly may include a first circuit associated with a first die and a through silicon via (TSV) coupling the first circuit to a second circuit. The apparatus may further include a first impedance matching inductor interposed between the TSV and the second circuit.

In another embodiment, a method for matching impedances in a flip-chip circuit assembly may include providing a die having a first circuit, and forming a TSV over the die. The method may further include providing a second circuit and forming a first impedance matching inductor interposed between the TSV and second circuit.

In another embodiment, a method for matching impedances in a flip-chip circuit assembly may include a step for providing a die having a first circuit; a step for forming a through silicon via (TSV) over the die; a step for providing a second circuit; and a step for forming a first impedance matching inductor interposed between the TSV and second circuit.

In another embodiment, an apparatus for matching impedances in a flip-chip circuit assembly may include a first circuit associated with a first die; means for coupling the first circuit to a second circuit; and a first means for impedance matching interposed between the coupling means and the second circuit.

BRIEF DESCRIPTION OF THE DRAWINGS

The accompanying drawings are presented to aid in the description of embodiments are provided solely for illustration of the embodiments and not limitation thereof.

DETAILED DESCRIPTION

Aspects of the embodiments are disclosed in the following description and related drawings directed to such embodiments. Alternate embodiments may be devised without departing from the scope of the invention. Additionally, well-known elements of the embodiments will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments of the disclosure" does not require that all embodiments of the disclosure include the discussed feature, advantage or mode of operation.

The terminology used herein is for the purpose of describing particular embodiments only and is not intended to be limiting of the embodiments described herein. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The various aspects of the embodiments may be embodied in a number of different forms, all of which have been contemplated to be within the scope of the claimed subject matter.

Figure 2A:
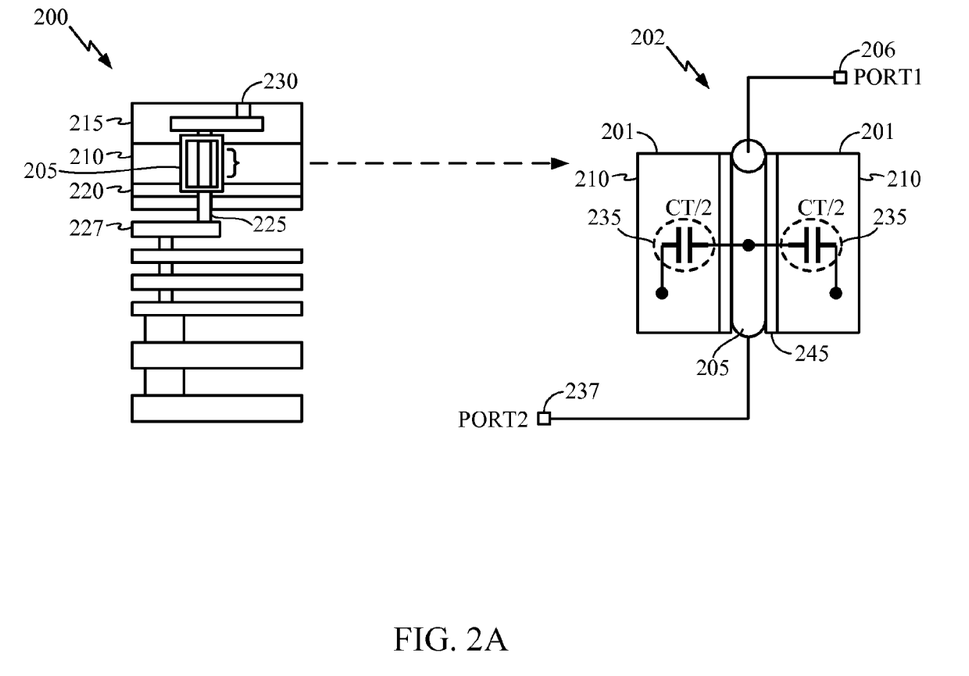
FIG. 2A is a diagram of a die for a three dimensional flip chip assembly and an associated model for illustrating the parasitic capacitance introduced by the TSV.

FIG. 2A is a diagram of a die 200 for a three dimensional flip chip assembly and an associated model 202 for illustrating the parasitic capacitance introduced by the TSV 205. The TSV 205 may be situated within a substrate 210, between Re-Distributed Layer (RDL) 215 and a silicon layer 220. A port 206 may be formed in the RDL to provide a connection to an external circuit (not shown). Another port 225 may be formed in a metal layer 227 for providing a connection to circuitry formed on other layers in die 200. An expanded view of the TSV area 205 provides a model 202 illustrating how a parasitic impedance may be formed by the TSV 205 and its surrounding structure. Between port 1 206 and port 2 237 the TSV 205 can transfer RF signals in a bi-directional manner. An insulation layer 245 in interposed between the TSV 205 and the substrate 210. The insulating layer may be any low k material. A capacitor CT may be formed between the TSV, which may be represented by two capacitors 235 connected in parallel, where each capacitor has a capacitance value of CT/2. When signals passing through the TSV 205 operate in RF frequencies, the parasitic capacitance CT can become significant enough to impact the performance of circuits connected to ports 237 and 206. Moreover, as die fabrication and TSV forming technologies advance, and also if RF frequencies continue to rise, the parasitic capacitance CT may increase, further affecting the performance of circuitry coupled between ports 237 and 206.

Figure 2B:
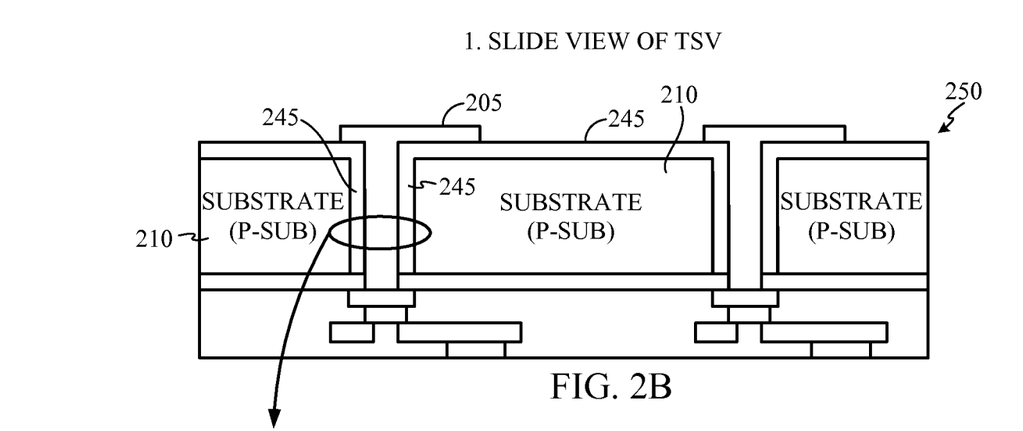
FIGS. 2B-2D show different perspectives of the TSV shown in FIG. 2A.
Figure 2C:
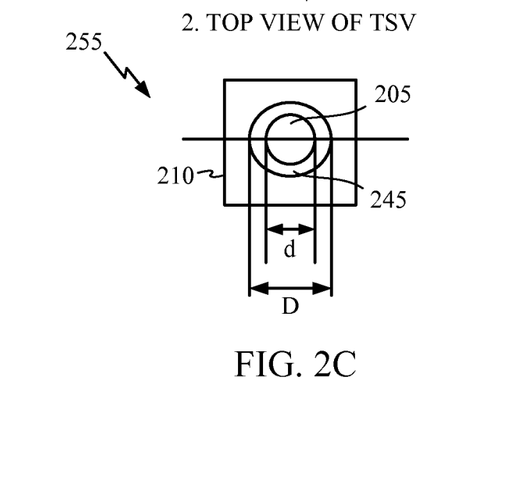
Figure 2D:
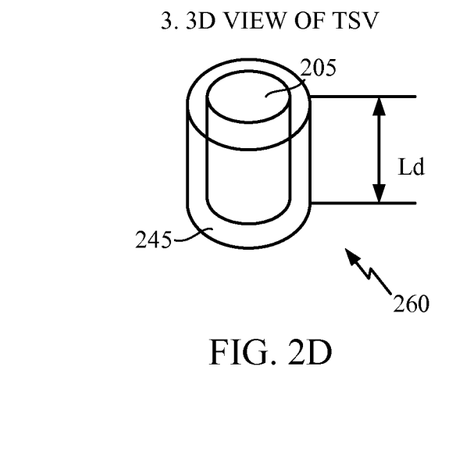

Referring to FIG. 2B, a side view 250 of the TSV 205 is provided, which illustrates the substrate (e.g., a p-type substrate as shown) surrounding the TSV 205. FIG. 2C shows a top view 255 of the TSV 205 that illustrates the structure may be coaxial in nature, where the TSV 205 can have a diameter d. The insulator 245 may have a diameter D. In FIG. 2D, a three-dimensional view 260 of the TSV 205 is shown. Here, it can be seen that the length of the TSV 205 may be represented by Ld. Using these parameters, the parasitic capacitance of the TSV 205 may be modeled as a coaxial structure using the following equation:

$$CT = \frac{2\pi\varepsilon_0\varepsilon_r}{\ln\left(\frac{D}{d}\right)}L_d$$

where $\varepsilon_0$ is permittivity of free space, and $\varepsilon_r$ is the relative permittivity of a typical polymer dielectric. Using the above equation, the capacitance of a TSV 205 may be approximately 80 fF (femto Farads). At RF frequencies, a parasitic capacitance of this magnitude can have an impact on the impedance matching for RF circuits.

Figure 3:
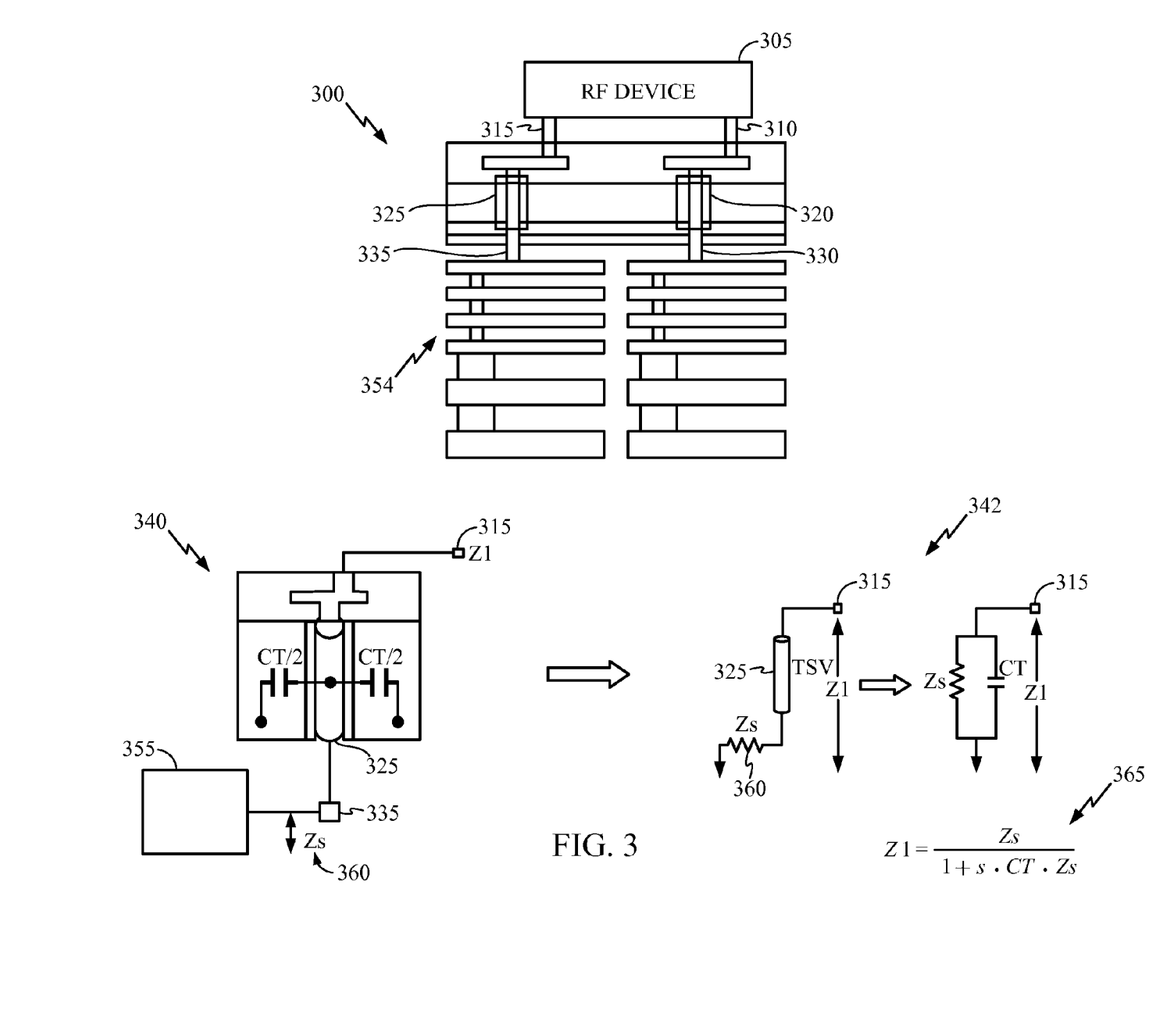
FIG. 3 is a diagram of an exemplary three dimensional flip chip assembly coupled to an RF device, also an associated circuit model for compensating the parasitic capacitance of the TSV is shown.

FIG. 3 is a diagram of an exemplary three dimensional flip chip assembly 300 coupled to an RF device 305, also shown is an associated circuit model 342 for characterizing the parasitic capacitance of the TSV. A discrete RF device 305 may be embedded by two TSVs 320 and 325. The RF device may a lumped device, a heterogeneous device, and/or be fabricated on another die. This connection may take place through two ports 310 and 315, respectively. One must realize that this configuration is merely exemplary, and other RF devices may be coupled using only one TSV/port combination, or as in other embodiments, any plurality thereof. In the assembly 300 shown in FIG. 3, the TSVs 320 and 325 are connected to two ports 330 and 335, respectively. The ideal impedance of ports 310 and 315 may be approximately 50 ohms, with no reactive component (i.e., no capacitive or inductive components). However, the parasitic capacitance of each TSV 320 and 325 impacts the impedance matching between the RF device 305 and the signal ports 330 and 335.

Further referring to FIG. 3, a refined model 340 is shown, which introduces the load of a circuit 355 to the TSV model 202 shown in FIG. 2. The circuit 355 can be an integrated circuit residing in the die 354. The circuit 355 may have an impedance 360 represented by Zs, as presented to port 335. Port 335 can in turn connect through TSV 325 to the RF device 305, via port 315. This arrangement may be further analyzed by schematic diagram 342. Here, the circuit impedance 360 may be modeled as a purely resistive load seen at port 335. The combined impedances of the circuit 355 and the TSV 325 may be further modeled as a parallel configuration of Zs 360 and CT as shown in schematic representation 342, to express the impedance (Z1) seen at port 315. The mathematical equation quantifying the impedance Z1 for this parallel model is shown in expression 365. Using this expression, the reactive component of Z1 which results from the parasitic capacitance of the TSV 325 may be quantified, and thus compensated therefore. For example, using from expression 365, assuming Zs is 50 ohm, CT is 100 fF, and the RF signal frequency is 2 GHz, then Z1(f=2 GHz) 49.8−j3.13. Approaches for compensating the reactive component of Z1 are further presented below.

Figure 4:
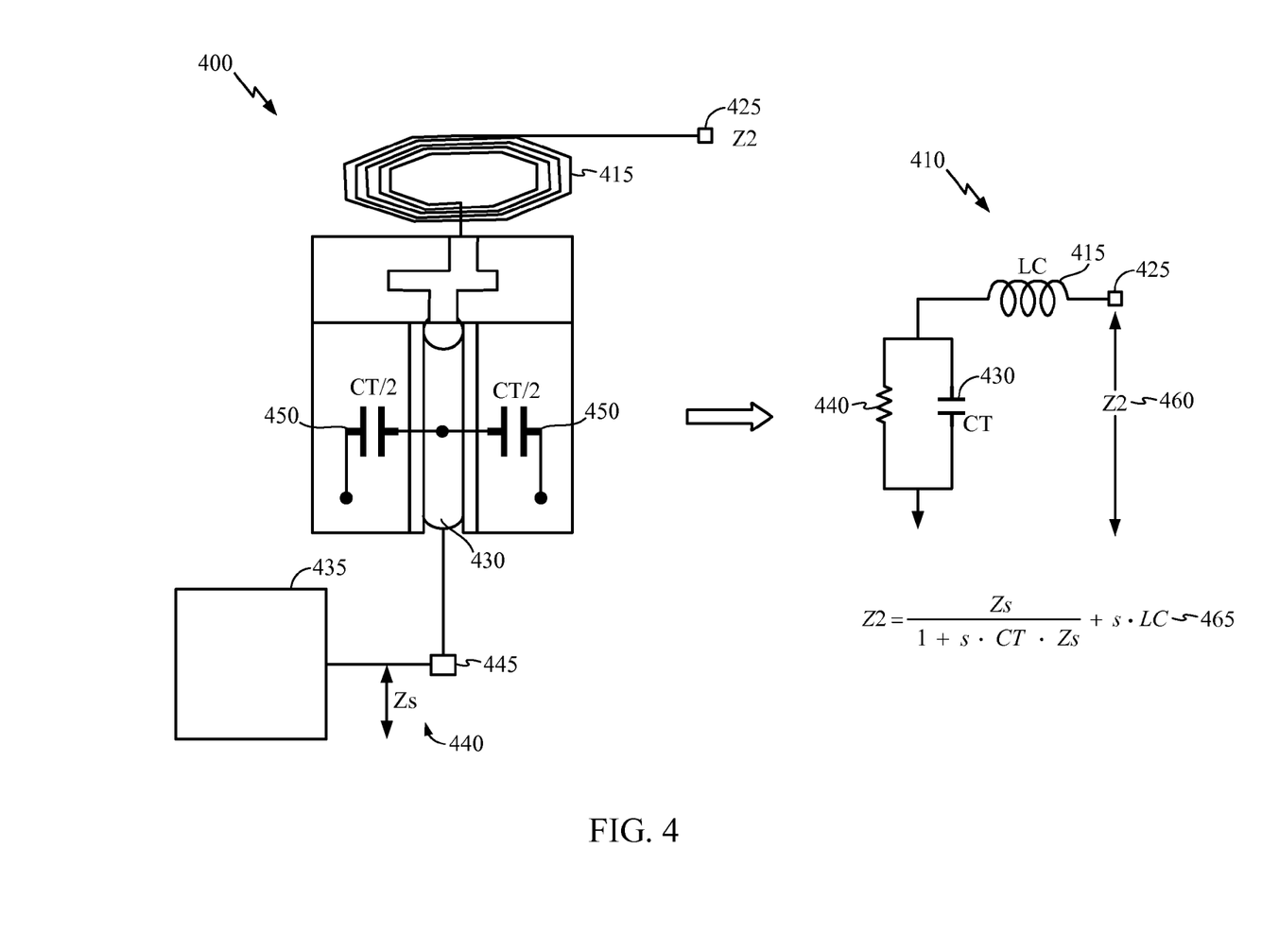
FIG. 4 shows diagram and a circuit model of an embodiment using an inductor for matching the TSV parasitic impedance.

FIG. 4 shows diagram 400 and a circuit model 410 thereof for an embodiment using an impedance matching inductor 415 for matching the parasitic impedance of the TSV 430. A model 400 is shown which introduces a series matching inductor 415 between the TSV 430 and the port 425. The impedance matching inductor 415 may be formed in an RDL (not shown). The RDL is typically used in three dimensional flip chip fabrication as an extra metal layer for a TSV connection with other tier die or wafer. Accordingly, the series inductor is designed within an RDL itself, thus obviating the need for an additional layer which could introduce additional complexity and cost into the fabrication process.

Similar to the model 340 shown in FIG. 3, the circuit 435 can be an integrated circuit residing in the die. The circuit 435 may have an impedance 440 represented by Zs, as presented to port 445. Port 445 can in turn connect through TSV 430 to the impedance matching inductor 415. The impedance matching inductor 415 may serially connect to the RF device not shown via port 425. This arrangement analyzed using the equivalent circuit schematic 410. Similar to the circuit shown in 342, the circuit impedance 440 may be modeled as a purely resistive load seen at port 445. The combined impedances of the circuit 440 and the TSV 450 may be modeled as a parallel configuration of Zs 440 and CT 430 as shown. The impedance matching inductor 415 may be connected serially between the parallel arrangement of Zs and CT, and port 425, to express the impedance (Z2) seen at port 425. The mathematical equation quantifying the impedance Z2 for model is shown in expression 465.

Using the expression 465 shown in FIG. 4, a value for the inductor 415 may be determined to compensate for the parasitic capacitance of the TSV 430. For example, from expression 465, assuming Zs is 50 ohm, CT is 100 fF, LC is 0.25 nH, and the RF signal frequency is 2 GHz, then Z2(f=2 GHz) ≈49.8−j0.012. Thus, introducing the impedance matching inductor having an inductance of 0.25 nH reduces the parasitic capacitance of the TSV by a factor of approximately 260.

Figure 5:
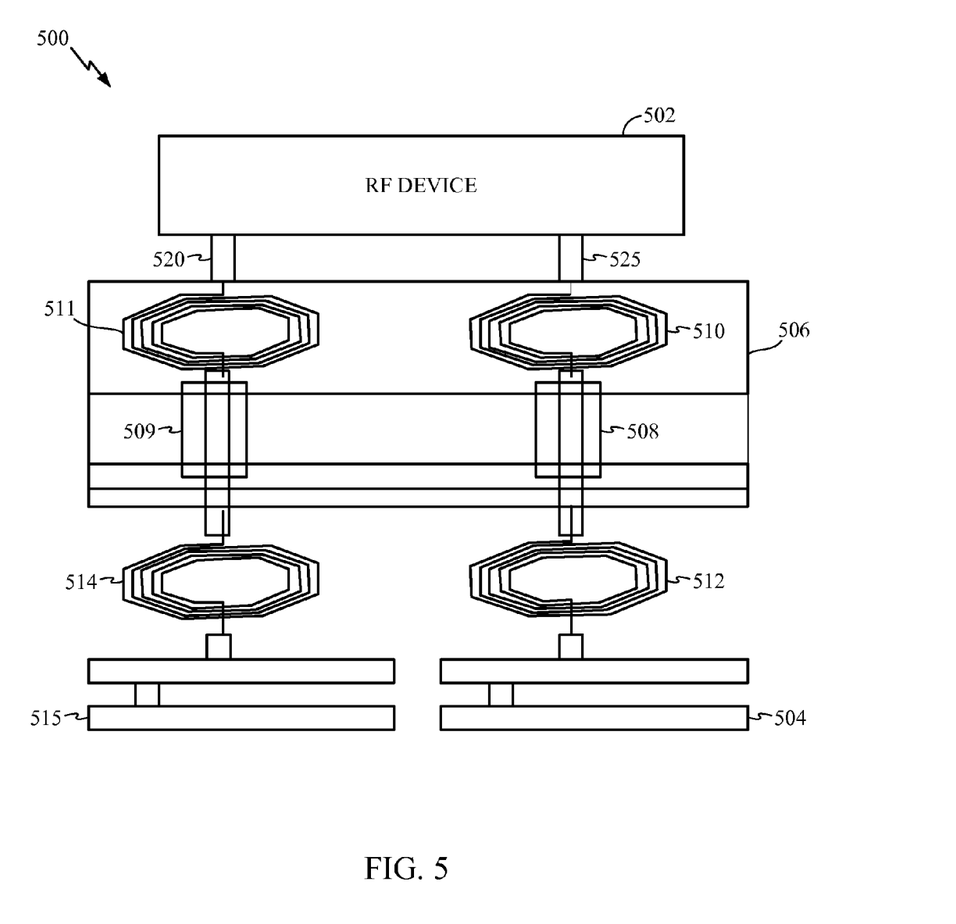
FIG. 5 shows diagram of another embodiment using two inductors for matching the TSV impedance.

FIG. 5 shows diagram of another embodiment using two inductors 511 and 514 on both sides of the TSV 509 for matching the TSV impedance. In this configuration, two inductors may be required to match the capacitance of the TSV, as utilizing only one inductor may result in an unfavorably sized component.

Here, a first impedance matching inductor 511 may be serially configured between the RF device 502 and the TSV 509. A second impedance matching inductor 514 may be place between the TSV 509 and the die 515. The first impedance matching inductor 511 may be formed in the RDL 506, while the second impedance matching inductor 514 may be formed in an Ml layer. As shown in FIG. 5, the RF device is utilizing two ports 520 and 525 to interface to the die 515 via two TSV ports 508 and 509. In this embodiment, each pair of TSV ports 508 and 509 may be associated with a pair of series inductors (510, 512 and 511, 514, respectively), wherein each inductor of the corresponding pair is placed on opposite sides of each TSV. One must realize that other embodiments are not restricted to this configuration. For example, the RF device may be connected to the die using only one TSV having series inductors at each end. In another example the two port configuration may have only one inductor associated with one TSV, and two inductors associated with another. Moreover, it should be noted that any number of impedance matched TSV ports may be used to connect an RF device to one or more dies.

Figure 6:
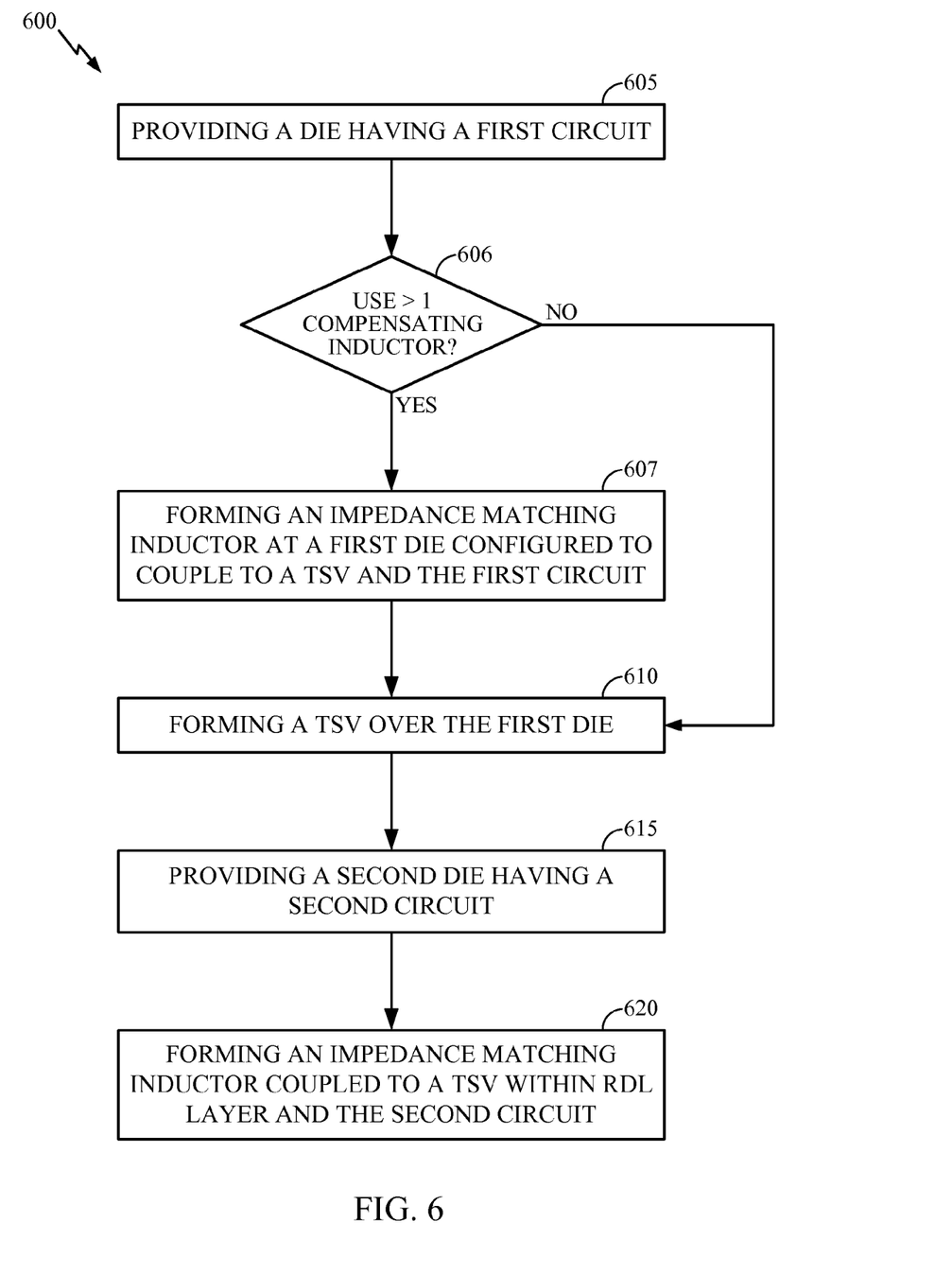
FIG. 6 is a flow chart illustrating an exemplary process for fabricating an embodiment for matching the parasitic capacitance of a TSV.

FIG. 6 is a flow chart illustrating an exemplary process 600 for fabricating an embodiment for matching the parasitic capacitance of a TSV. The process 600 may start by providing a die 504 associated with a first circuit (Block 605). The die may be provided using conventional flip chip stacking techniques, and may be manufactured using any known CMOS technique and/or other known suitable fabrication techniques. Next, it may be determined that more than one compensating inductor may be used to compensate the parasitic capacitance of the TSV (Block 606). This determination may be performed during the design of the impedance matching and/or afterwards once the impedances are empirically determined. In this option, as shown in FIG. 5, two inductors (e.g., 510 and 512) may be placed on either side of the TSV 508. If more than one compensating inductor is desired, then, for example, an additional impedance matching inductor 512 may be formed at a first die associated with a first circuit (Block 607). The inductor 512 may be formed using conventional etching techniques, and will be configured so that it may be electrically coupled to a TSV 508. The TSV 508 may then be formed over the die 504 (Block 610). The TSV may be formed using known CMOS and flip chip stacking techniques. In other embodiments, other fabrication techniques may be used. A second circuit 502 may be provided for connection with a first circuit (not shown) within the die 504 (Block 615). In some embodiments, the second circuit may be associated with a second die, and fabricated using conventional CMOS techniques. An impedance matching inductor 510 may be formed in an RDL 506, where the inductor couples the TSV 508 and the second circuit 502 (Block 620). The impedance matching inductor 510 may be formed using metal etching techniques. In another embodiment, additional pairs of compensating inductors (e.g., 511 and 514) may be formed in a manner similar to the process described above, to compensate for additional TSVs used to couple to an RF Device 502 having multiple ports (e.g., 520, 525).

It will be appreciated that dies having impedance matching circuits for TSVs as illustrated, for example in FIGS. 4-5 may be included within a mobile phone, portable computer, handheld personal communication system (PCS) unit, portable data units such as personal data assistants (PDAs), GPS enabled devices, navigation devices, set-top boxes, music players, video players, entertainment units, fixed location data units such as meter reading equipment, or any other device that stores or retrieves data or computer instructions, or any combination thereof. Accordingly, embodiments of the disclosure may be suitably employed in any device which includes such impedance matched TSVs.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. An apparatus for matching impedances in a flip-chip circuit assembly, comprising:
   a first circuit associated with a first die;
   a through silicon via (TSV) conductively connecting the first circuit to a second circuit; and
   a first impedance matching inductor connected in series between the TSV and the second circuit.

2. The apparatus of claim 1, further comprising:
   a second impedance matching inductor interposed between the through silicon via and the first circuit.

3. The apparatus of claim 2, wherein the second impedance matching inductor is formed in a metal layer in the first die.

4. The apparatus of claim 2, wherein the first and second impedance matching inductors are part of an RF impedance matching circuit compensating the parasitic capacitance of the TSV.

5. The apparatus of claim 1, wherein the first impedance matching inductor is formed in a Re-Distributed Layer (RDL).

6. The apparatus of claim 1, wherein the second circuit is associated with a second die.

7. The apparatus of claim 6, wherein the second die is placed on the first die in a three-dimensional flip chip configuration.

8. The apparatus of claim 1, wherein the first circuit and second circuit operate at RF frequencies.

9. The apparatus of claim 1, wherein the first die is fabricated using a Complimentary Metallic Oxide Semiconductor (CMOS) process.

10. The apparatus of claim 1 further including a device, selected from the group consisting of a set top box, music player, video player, entertainment unit, navigation device, communications device, personal digital assistant (PDA), fixed location data unit, and a computer, into which the apparatus is integrated.

11. A method for matching impedances in a flip-chip circuit assembly, comprising:
   providing a die having a first circuit;
   forming a through silicon via (TSV) over the die;
   providing a second circuit, wherein the TSV conductively connects the first circuit and the second circuit; and
   forming a first impedance matching inductor connected in series between the TSV and second circuit.

12. The method of claim 11, further comprising:
   determining whether to compensate the TSV using a second impedance matching inductor; and
   forming the second impedance matching inductor in between the TSV and the first circuit.

13. The method of claim 12, further comprising:
   forming the second impedance matching inductor in a metal layer associated with the die.

14. The method of claim 12, wherein the first and second impedance matching inductors are part of an RF impedance matching circuit compensating the parasitic capacitance of the TSV.

15. The method of claim 11, further comprising:
   forming the first impedance matching inductor in a Re-Distributed Layer (RDL).

16. The method of claim 11, further comprising:
   forming the first impedance matching inductor using a Complimentary Metallic Oxide Semiconductor (CMOS) process.

17. The method of claim 11, wherein the die is associated with a three-dimensional flip chip process.

18. The method of claim 11, wherein the first circuit and second circuit operate at RF frequencies.

19. The method of claim 11, wherein the die is fabricated using a Complimentary Metallic Oxide Semiconductor (CMOS) process.

20. A method for matching impedances in a flip-chip circuit assembly, comprising:
   step for providing a die having a first circuit;
   step for forming a through silicon via (TSV) over the die;
   step for providing a second circuit, wherein the TSV conductively connects the first circuit and the second circuit; and
   step for forming a first impedance matching inductor connected in series between the TSV and second circuit.

21. The method of claim 20, further comprising:
   step for determining whether to compensate the TSV using a second impedance matching inductor; and
   step for forming the second impedance matching inductor in between the TSV and the first circuit.

22. The method of claim 20, further comprising:
   step for forming the first impedance matching inductor in a Re-Distributed Layer (RDL).

23. The method of claim 20, further comprising:
   step for forming the first impedance matching inductor using a Complimentary Metallic Oxide Semiconductor (CMOS) process.

24. An apparatus for matching impedances in a flip-chip circuit assembly, comprising:
   a first circuit associated with a first die, the first die comprising a substrate;
   a means for conductively connecting, the means for conductively connecting to electrically connect the first circuit to a second circuit associated with a second die, wherein the means for conductively connecting comprises a conductive via and an insulator to insulate the conductive via from the substrate, wherein the means for conductively connecting is situated within the first die and passes completely through the substrate so as to have capacitive reactance; and
   a first means for impedance matching, the first means for impedance matching connected in series between the means for conductively connecting and the second circuit so as to compensate the reactive capacitance at a signal frequency.

25. The apparatus of claim 24, further comprising:
   a second means for impedance matching interposed between the means for conductively connecting and the first circuit, wherein the second means for impedance matching and the first means for impedance matching together compensate the reactive capacitance at the signal frequency.

26. The apparatus of claim 25, wherein the second means for impedance matching is formed in a metal layer in the first die.

27. The apparatus of claim 25, wherein the first means and second means for impedance matching each have inductive reactance.

28. The apparatus of claim 24, wherein the first means for impedance matching is formed in a Re-Distributed Layer (RDL).

29. The apparatus of claim 24, wherein the first circuit and second circuit operate at RF frequencies.

30. The apparatus of claim 24, wherein the first die is fabricated using a Complimentary Metallic Oxide Semiconductor (CMOS) process.

31. The apparatus of claim 24, wherein the second die is placed on the first die in a three-dimensional flip chip configuration.

32. The apparatus of claim 24 further including a device, selected from the group consisting of a set top box, music player, video player, entertainment unit, navigation device, communications device, personal digital assistant (PDA), fixed location data unit, and a computer, into which the apparatus is integrated.

* * * * *